United States Patent
Suryanarayana et al.

(10) Patent No.: US 6,831,487 B2
(45) Date of Patent: Dec. 14, 2004

(54) PATTERN BASED DYNAMIC DRIVE CURRENT BALANCING FOR DATA TRANSMISSION

(75) Inventors: Samudyatha Suryanarayana, Sunnyvale, CA (US); Priya Ananthanarayanan, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/393,303

(22) Filed: Mar. 20, 2003

(65) Prior Publication Data

US 2004/0183573 A1 Sep. 23, 2004

(51) Int. Cl.[7] .............................................. H03B 21/00
(52) U.S. Cl. ...................................................... 327/112
(58) Field of Search ........................ 326/26–27, 82–87; 327/108, 112, 379, 383–384, 389, 427, 434

(56) References Cited

U.S. PATENT DOCUMENTS

| | | | | |
|---|---|---|---|---|
| 5,192,879 A | * | 3/1993 | Aoki et al. | 326/87 |
| 5,444,402 A | * | 8/1995 | McMahon et al. | 327/170 |
| 5,708,386 A | * | 1/1998 | Chow | 327/380 |
| 6,043,683 A | * | 3/2000 | Bae | 326/87 |

* cited by examiner

Primary Examiner—My-Trang Nu Ton
(74) Attorney, Agent, or Firm—Osha & May L.L.P.

(57) ABSTRACT

A driver stage uses a primary driver and a secondary driver to balance drive current when transmitting a new data bit different than bits consecutively transmitted immediately previous to the new data bit. The primary driver activates one of a pull-down device and a pull-up device whenever transmitting a data bit. The secondary driver activates one of its pull-down device and a pull-up device when two or more consecutive are detected to be transmitted. In this case, current flow of the driver stage induced by the first of the consecutive bits is reduced by the secondary driver.

13 Claims, 7 Drawing Sheets

*Strength of Devices in Primary Drivers 60 >> Strength of Devices in Secondary Driver 62*

PATTERN BASED DYNAMIC DRIVE CURRENT BALANCING FOR DATA TRANSMISSION

BACKGROUND OF INVENTION

Figure 1:
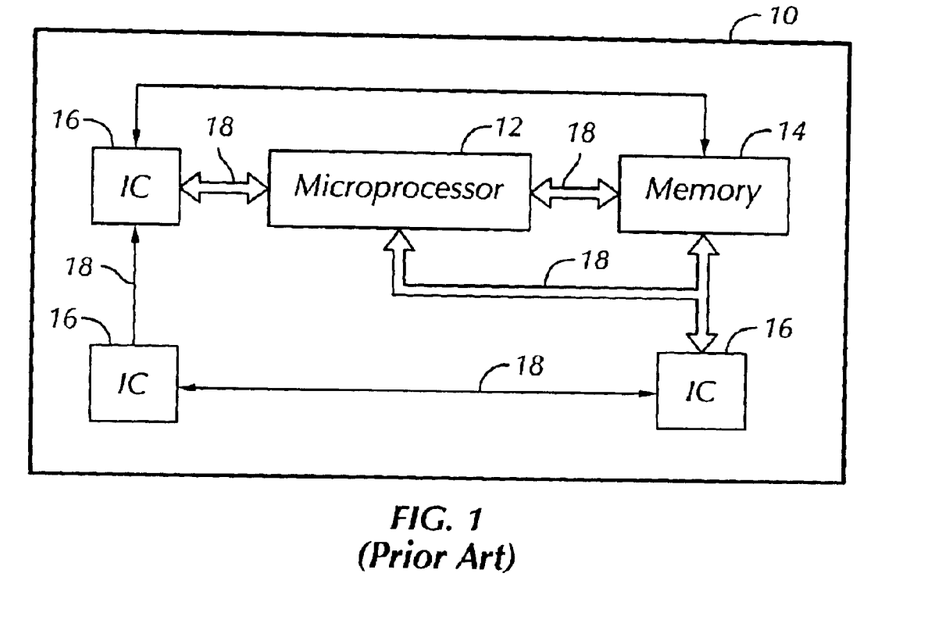
FIG. 1 shows a typical computer system.

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 18, e.g., wires, buses, etc., to accomplish the various tasks of the computer system 10.

When an integrated circuit (16 in FIG. 1) communicates with another integrated circuit, i.e., "chip-to-chip communication," data is transmitted in a series of binary 0's and 1's from a transmitting circuit to a receiving circuit. Accordingly, at any particular time, a data signal received at the receiving circuit may have a low voltage potential representative of a binary '0' or a high voltage potential representative of a binary '1.'

Figure 2:
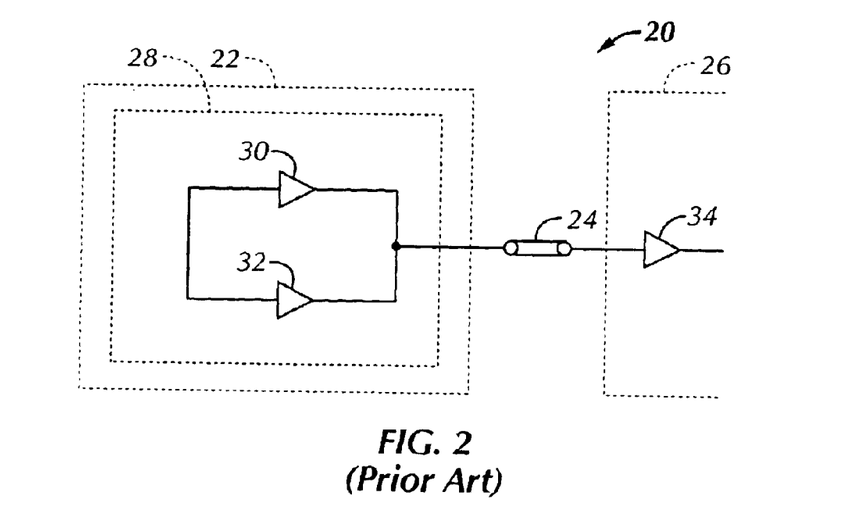
FIG. 2 shows a portion of a typical transmission system.

FIG. 2 shows a portion of a typical transmission system 20. The transmission system 20 includes a transmitting circuit 22, a data channel (also known as a "board trace") 24, and a receiving circuit 26. Generally, circuit-to-circuit wireline communication occurs by one circuit transmitting data and another circuit receiving the data over wires implemented on a computer board on which the sending and receiving circuits are disposed. As shown in FIG. 2, the transmitting circuit 22 drives data into the data channel 24 using the a driver stage 28 formed by a first driver 30 and a second driver 32. The receiving circuit 26 receives the data at the other end of the data channel 24 using some receiving device 34.

As mentioned above, in data signaling, a data bit is driven into the data channel 24 using specific voltage levels, i.e., logic high and logic low. In binary transmission, in which data is coded as a series of 1's and 0's, a '1' could be represented by any voltage above a particular value and a '0' could be represented by any voltage below a particular value.

Figure 3:
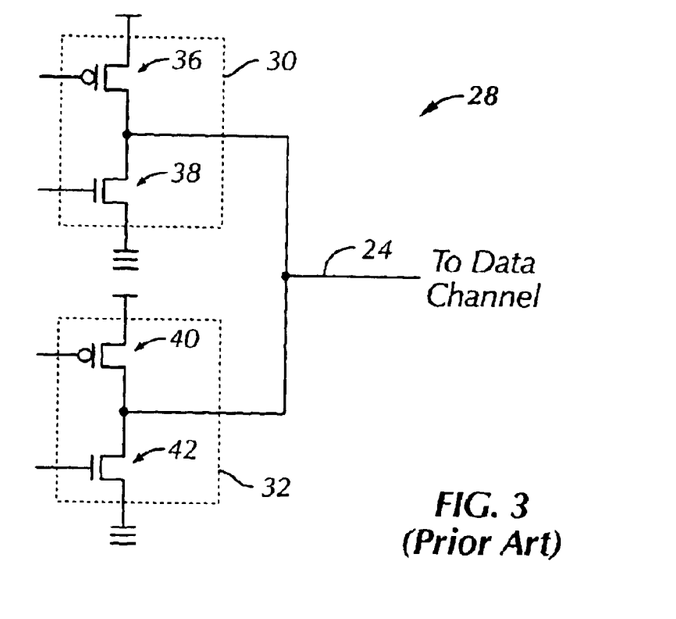
FIG. 3 shows a typical driver stage.

FIG. 3 shows a schematic of the driver stage 28 shown in FIG. 2. The first driver 30 is formed using a pull-up device 36 and a pull-down device 38, and the second driver 32 is formed using a pull-up device 40 and a pull-down device 42. Those skilled in the art will understand that the inputs to the driver 30 and the second driver 32 are controlled separately in order to control, among other things, crow bar currents and voltage swing levels on the data channel 24. When activated, each of the pull-up and pull-down devices 36, 38, 40, and 42 effectively form a resistance, and when deactivated, each of the pull-up and pull-down devices 36, 38, 40, and 42 form an open circuit, or +infinite resistance.

Figure 4:
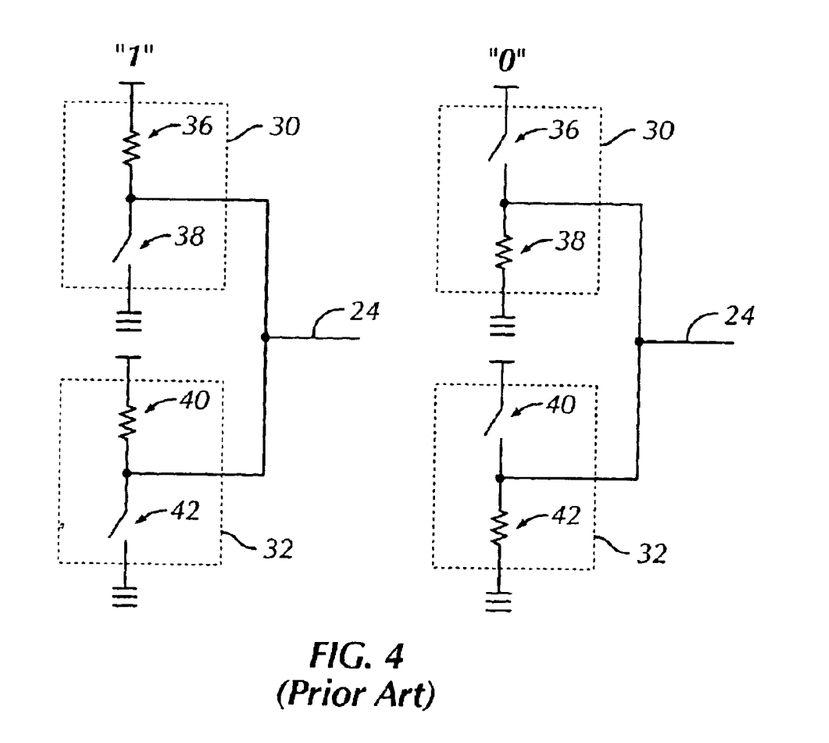
FIG. 4 shows states of the driver stage shown in FIG. 3.

FIG. 4 shows different states of the driver stage 28. When the driver stage 28 drives a '1,' the pull-up devices 36 and 40 of the first and second drivers 30 and 32, respectively, are switched 'on,' or otherwise activated, and the pull-down devices 38 and 42 of the first and second drivers 30 and 32, respectively, are switched 'off,' or otherwise deactivated. This arrangement of the pull-up and pull-down devices 36, 38, 40, and 42 causes the driver stage 28 to pull up the voltage value on the data channel 24.

Alternatively, when the driver stage 28 drives a '0,' the pull-down devices 38 and 42 of the first and second drivers 30 and 32, respectively, are switched 'on,' or otherwise activated, and the pull-up devices 36 and 40 of the first and second drivers 30 and 32, respectively, are switched 'off,' or otherwise deactivated. This arrangement of the pull-up and pull-down devices 36, 38, 40, and 42 causes the driver stage 28 to pull down the voltage value on the data channel 24.

As discussed with reference to FIG. 4, the driver stage 28, when driving a '1,' places a voltage step on the data channel 24. However, because the data channel 24 is typically lossy at high frequencies, the voltage step generated by the driver stage 28 suffers skin effect and dielectric loss. Losses in long data channels do not only introduce attenuation of data signal integrity, but more significantly, cause signal distortion. Such distortion results in intersymbol interference (ISI), which is described below.

A significant factor in achieving the highest possible data rate relates to the signal to noise ratio present at the receiving circuit. The noise present at the receiving circuit includes noise introduced by the data channel and noise attributable to interference from preceding bits of data. Such interference is ISI. ISI is a distortion in the received signal resulting from the temporal spreading and consequent overlap of individual signal pulses and to the degree that the receiving circuit cannot reliably distinguish between changes of state. It follows that at a certain threshold, intersymbol interference compromises the integrity of the data signal at the receiving circuit.

All of the effects discussed above that result from signal attenuation along the data channel leads to data jitter, which means that data does not reach a receiving circuit at the same time with respect to a clock signal for every data bit sent. This leads to uncertainty in data capture at the receiving circuit. Moreover, when a series of 1's or 0's are transmitted over a long data channel, jitter is amplified because the voltage swing at the receiving circuit increases or decreases depending on the number of consecutive 1's or 0's transmitted.

Figure 5:
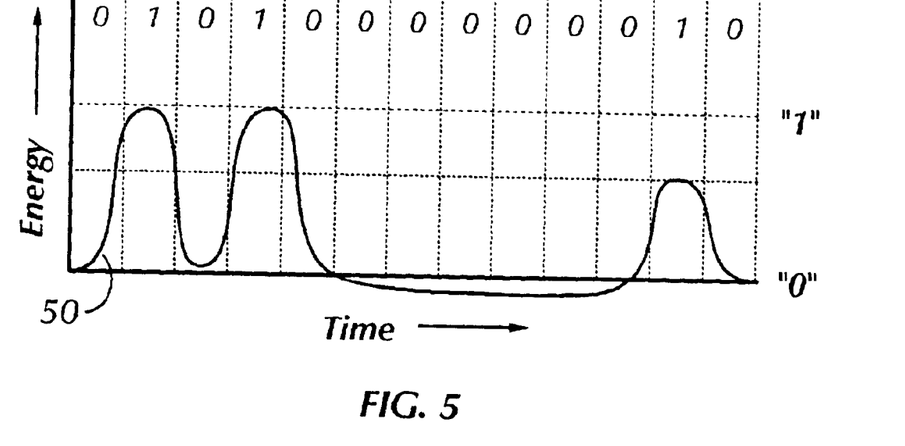
FIG. 5 shows a behavior of a data signal in the transmission system shown in FIG. 2 and using the driver stage shown in FIG. 3.

To this end, FIG. 5 shows a behavior of a data signal 50 in the transmission system 20 shown in FIG. 2 and using a driver stage 28 as described with reference to FIGS. 3 and 4. In the bit sequence shown in FIG. 5, the transmittal of the first four bits, '0101,' to the data channel (24 in FIGS. 2, 3, and 4) from the driver stage (28 in FIGS. 2, 3, and 4) occurs by switching the state of the driver stage (28 in FIGS. 2, 3, and 4) between the '0' arrangement and '1' arrangement shown in FIG. 4. The next several bits transmitted by the driver stage (28 in FIGS. 2, 3, and 4) are 0's, and thus, the driver stage (28 in FIGS. 2, 3, and 4) remains in the '0' arrangement shown in FIG. 4 for some amount of time.

As shown in FIG. 5, as the driver stage (28 in FIGS. 2, 3, and 4) remains in the '0' arrangement shown in FIG. 4, the data signal 50 drifts to a voltage value below the '0' threshold. Then, when the driver stage (28 in FIGS. 2, 3, and 4) is again required to transmit a '1,' the voltage step driven onto the data channel (24 in FIGS. 2, 3, and 4) by the driver stage (28 in FIGS. 2, 3, and 4) results in the data signal 50 reaching a voltage value less than that reached previously when driving a '1.' Accordingly, as discussed above, such signal attenuation leads to ISI and increased data jitter.

Figure 6:
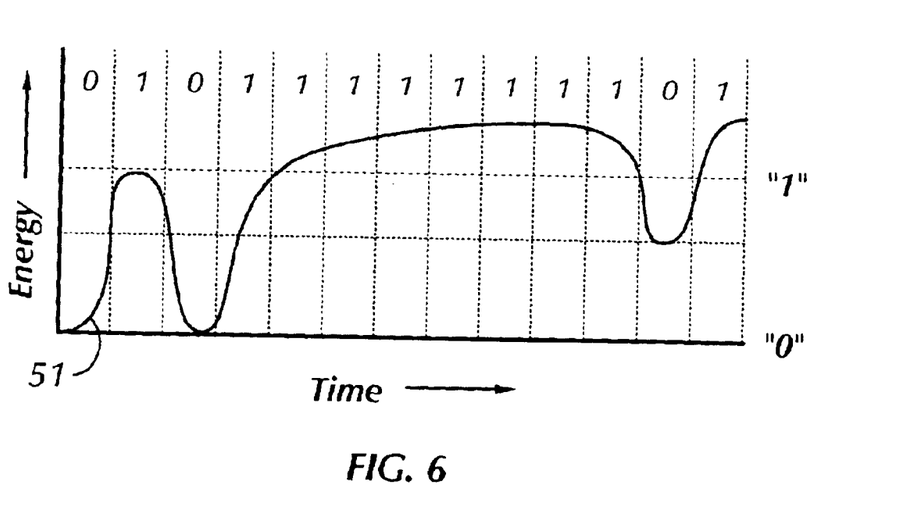
FIG. 6 shows a behavior of a data signal in the transmission system shown in FIG. 2 and using the driver stage shown in FIG. 3.

FIG. 6 shows a behavior of a data signal 51 in the transmission system 20 shown in FIG. 2 and using a driver stage 28 as described with reference to FIGS. 3 and 4. In the bit sequence shown in FIG. 6, the transmittal of the first four bits, '0101,' to the data channel (24 in FIGS. 2, 3, and 4) from the driver stage (28 in FIGS. 2, 3, and 4) occurs by switching the state of the driver stage (28 in FIGS. 2, 3, and 4) between the '0' arrangement and '1' arrangement shown in FIG. 4. The next several bits transmitted by the driver stage (28 in FIGS. 2, 3, and 4) are 1's, and thus, the driver stage (28 in FIGS. 2, 3, and 4) remains in the '1' arrangement shown in FIG. 4 for some amount of time.

As shown in FIG. 6, as the driver stage (28 in FIGS. 2, 3, and 4) remains in the '1' arrangement shown in FIG. 4, the data signal 51 drifts to a voltage value above the '1' threshold. Then, when the driver stage (28 in FIGS. 2, 3, and 4) is again required to transmit a '0,' the voltage drop driven onto the data channel (24 in FIGS. 2, 3, and 4) by the driver stage (28 in FIGS. 2, 3, and 4) results in the data signal 51 reaching a voltage value greater than that reached previously when driving a '0.' Accordingly, similar to the situation discussed with reference to FIG. 5, such signal attenuation leads to ISI and increased data jitter.

SUMMARY OF INVENTION

According to one or more embodiments of the present invention, a transmission system comprises: a driver stage operatively connected to a data channel, where the driver stage comprises a primary driver arranged to induce a first current flow in the driver stage dependent upon detection of a first data bit to be transmitted to the data channel, and a secondary driver arranged to reduce the first current flow dependent upon detection of a second data bit to be transmitted to the data channel, where the first data bit is logically equal to the second data bit; and a receiving circuit operatively connected to the data channel.

According to one or more embodiments of the present invention, a method for transmitting a data signal using a driver circuit comprises: detecting for a pattern of bits on the data signal; when consecutive bits of the same value are detected, inducing partial current flow in the driver circuit in a direction opposite to a flow of current induced by the driver circuit when the first of the consecutive bits was detected; and transmitting the data signal.

According to one or more embodiments of the present invention, an apparatus comprises: means for propagating a signal between at least two circuits; means for driving the signal onto the means for propagating, where the means for driving comprises primary means for driving on the signal a first bit, where a first flow of current is induced in the means for driving when driving the first bit, and secondary means for reducing the first flow of current in the means for driving when a second bit of the same logic value as the first bit is transmitted; and means for receiving the data signal.

Other aspects and advantages of the invention will be apparent from the following description and the appended claims.

DETAILED DESCRIPTION

Embodiments of the present invention relate to a transmission system driver stage that balances drive current so as to improve data transmission across the transmission system.

A driver stage in accordance with embodiments of the present invention uses a primary driver and a secondary driver. Collectively, the driver stage uses two pull-down devices (or units) and two pull-up devices (or units), where one pair including a pull-up device and a pull-down device is weaker in strength than the another pair including the other pull-up device and the other pull-down device. The primary driver is used to drive every data bit onto a data channel. When two consecutive bits of the same state are detected, one of the pull-up device and the pull-down device in the secondary driver is activated to induce current flow on the data channel in a direction opposite to that induced by the primary driver when the first of the consecutive bits was detected.

Figure 7:
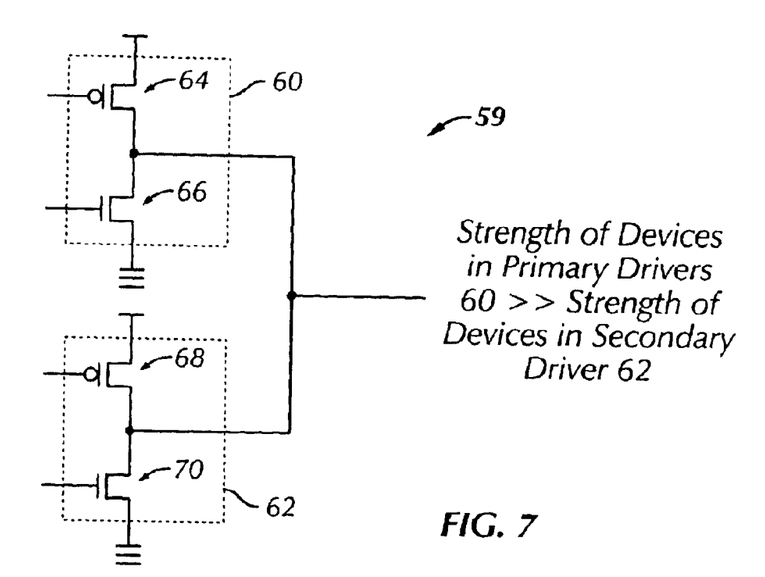
FIG. 7 shows a driver stage in accordance with an embodiment of the present invention.

FIG. 7 shows a driver stage 59 in accordance with an embodiment of the present invention. The driver stage 59 includes a primary driver 60 and a secondary driver 62. The primary driver 60 uses a pull-up device 64 and a pull-down device 66, and the secondary driver 62 uses a pull-up device 68 and a pull-down device 70. Note that unlike the driver stage shown in FIG. 3, the pull-up device 64 and pull-down device 66 in the primary driver 60 (corresponding to the first driver 30 in FIG. 3) are stronger than the pull-up device 68 and the pull-down device 70 in the secondary driver 62 (corresponding to the second driver 32 in FIG. 3). When activated, each of the pull-up and pull-down devices 64, 66, 68, and 70 effectively form a resistance, and when deactivated, each of the pull-up and pull-down devices 64, 66, 68, and 70 form an open circuit, or infinite resistance.

Figure 8:
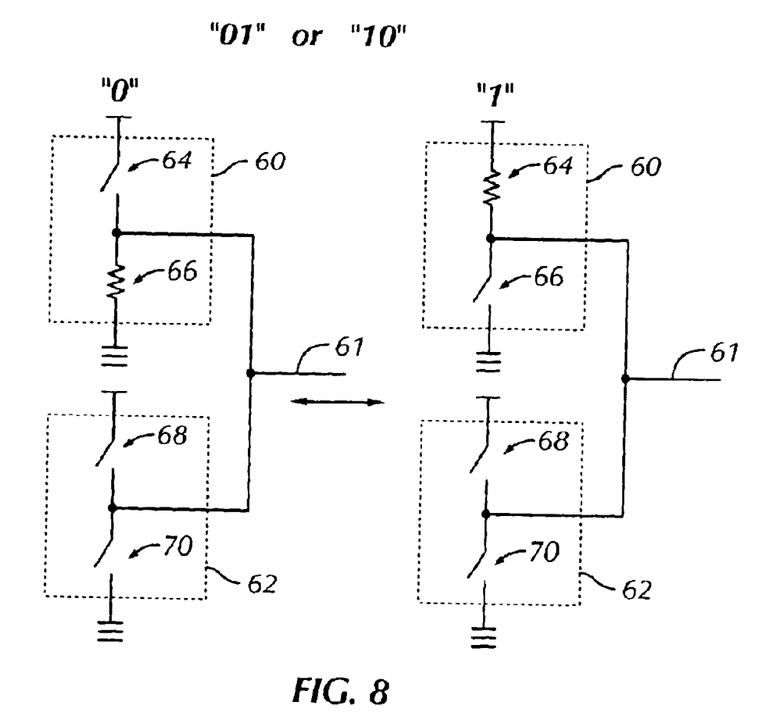
FIG. 8 shows states of a driver stage in accordance with an embodiment of the present invention.

Referring now to FIG. 8, when the driver stage 59 shown in FIG. 7 is required to transmit alternating data bits, i.e., 01's and 10,' the driver stage 59 toggles between the '0' arrangement and '1' arrangement shown in FIG. 7. As shown in FIG. 7, whenever the transmittal of alternating data bits is detected, the pull-up device 68 and the pull-down device 70 in the secondary driver 62 are deactivated, or switched 'off,' and the primary driver 60 is solely used to drive the data bits onto a data channel 61.

When transmitting a '0' in an alternating data bit pattern, the pull-up device 64 in the primary driver 60 is deactivated, or switched 'off,' and the pull-down device 66 in the primary driver 60 is activated, or switched 'on.' This '0' arrangement causes the driver stage 59 to pull down the voltage on the data channel 61.

When transmitting a '1' in an alternating data bit pattern, the pull-up device 64 in the primary driver 60 is activated, or switched 'on,' and the pull-down device 66 in the primary driver 60 is deactivated, or switched 'off.' This '1' arrangement causes the driver stage 59 to pull up the voltage on the data channel 61.

Figure 9:
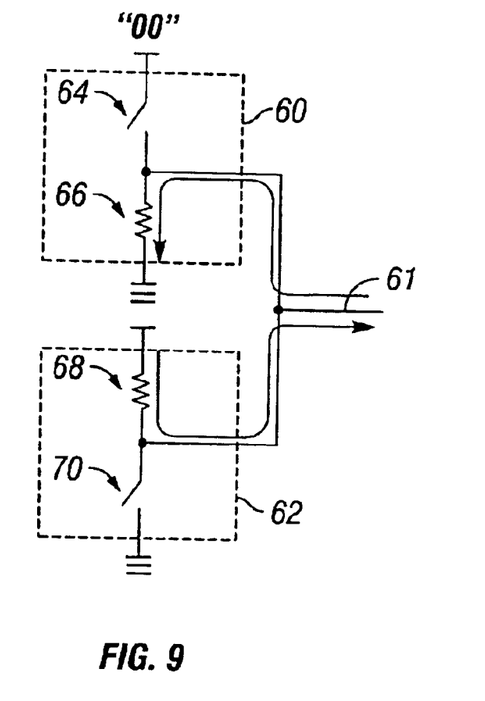
FIG. 9 shows a state of a driver stage in accordance with an embodiment of the present invention.
Figure 10:
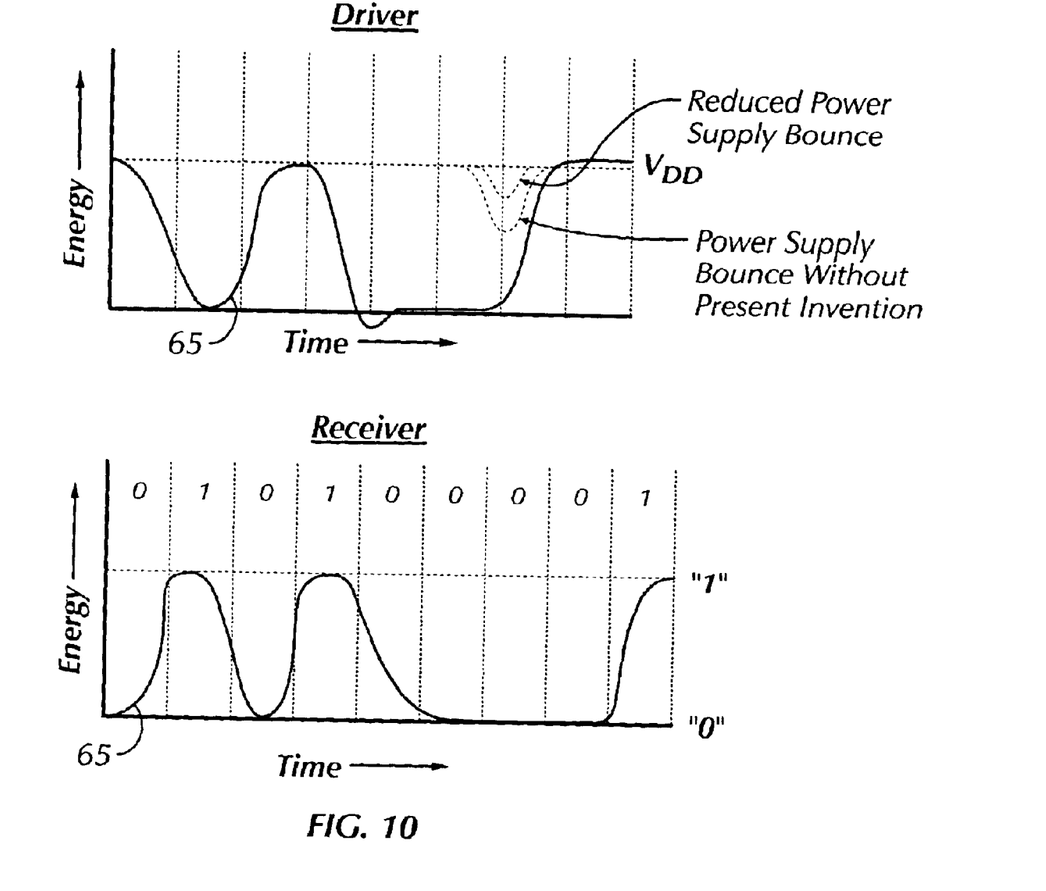
FIG. 10 shows a behavior of a data signal using the driver stage shown in FIG. 8.

Referring now to FIG. 9, when consecutive 0's are detected to be transmitted, the driver stage 59 is controlled to enter the arrangement shown in FIG. 9. Particularly, when consecutive 0's are transmitted, the pull-up device 68 in the secondary driver 62 is activated, or switched 'on,' in addition to the pull-down device 66 in the primary driver 60 already being activated due to the detection of at least one '0.' Because the pull-up device 68 in the secondary driver 62 is activated, current flow is induced as shown by the arrow in FIG. 9 in a direction opposite to that induced by the primary driver 60 when the first of the consecutive 0's was detected (those skilled in the art will understand that the direction of the main current flow occurs from the data channel 61 through device 66 to ground). This arrangement thus balances the drive current in the driver stage 59. When a '1' is transmitted (after consecutive 0's), pull-up device 64 is activated, and because some of the current is already flowing in a direction now induced by the driver stage 59, the magnitude of current change is reduced, thereby reducing power supply bounce on the data channel 61, which, in turn leads to improved edge rates. The effect of such an arrangement on the behavior of a data signal both at the driver side and the receiver side is shown by the data signal 65 in FIG. 10.

Figure 11:
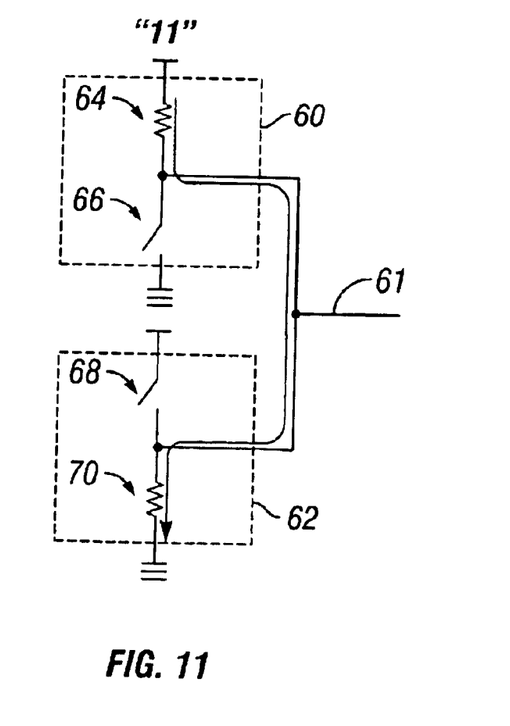
FIG. 11 shows a state of a driver stage in accordance with an embodiment of the present invention.
Figure 12:
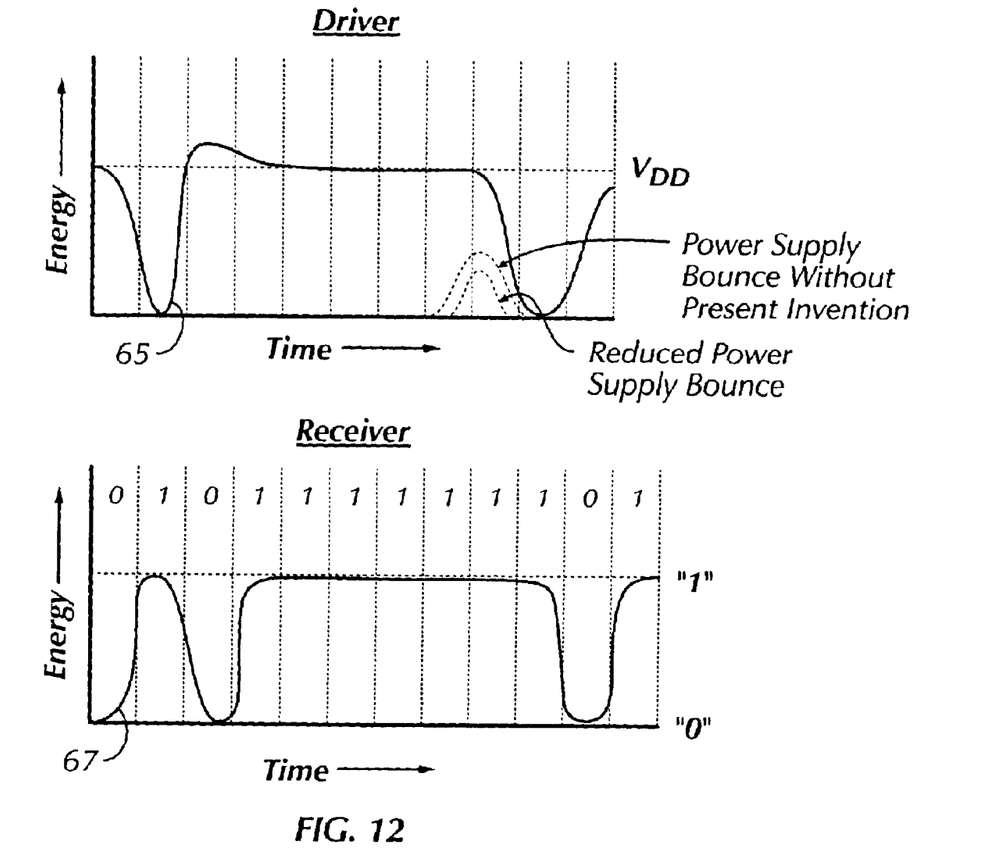
FIG. 12 shows a behavior of a data signal using the driver stage shown in FIG. 10.

Referring now to FIG. 11, when consecutive 1's are detected to be transmitted, the driver stage 59 is controlled to enter the arrangement shown in FIG. 11. Particularly, when consecutive 1's are transmitted, the pull-down device 70 in the secondary driver 62 is activated, or switched 'on,' in addition to the pull-up device 64 in the primary driver 60 already being activated due to the detection of at least one '1.' Because the pull-down device 70 in the secondary driver 62 is activated, current flow is induced as shown by the arrow in FIG. 11 in a direction opposite to that induced by the primary driver 60 when the first of the consecutive 1's was detected. This arrangement thus balances the drive current in the driver stage 59. When a '0' is transmitted (after consecutive 1's), pull-down device 66 is activated, and because some of the current is already flowing in a direction now induced by the driver stage 59, the magnitude of current change is reduced, thereby reducing power supply bounce on the data channel 61, which, in turns, leads to improved edge rates. The effect of such an arrangement on the behavior of a data signal at both the driver stage and the receiver stage is shown by the data signal 67 in FIG. 12.

Advantages of the present invention may include one or more of the following. In one or more embodiments, because the magnitude of current change is reduced when a new data bit is transmitted after a consecutive series of data bits, power supply bounce on a data channel propagating the data bits may be reduced. Accordingly, improved edge rates may be achieved.

In one or more embodiments, because the magnitude of current change is reduced when using a driver stage that balances drive current, delay variation may be reduces, thereby leading to reduced data jitter.

In one or more embodiments, because the magnitude of current change is reduced when using a driver stage that balances drive current, signal loss typical on a data channel at a high frequency may be reduced.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A transmission system, comprising:
    a driver stage operatively connected to a data channel, the driver stage comprising:
        a primary driver controlled to induce current flow in a first direction on the data channel when the driver stage is required to transmit a first data bit onto the data channel, and
        a secondary driver controlled to induce current flow in a second direction on the data channel opposite to the first direction when the driver stage is required to transmit a second data bit onto the data channel, the second data bit having a logic value equal to that of the first data bit, and wherein the first data bit and the second date bit are consecutive; and
    a receiving circuit operatively connected to the data channel.

2. The transmission system of claim 1, wherein the secondary driver is deactivated when the driver stage is required to transmit consecutive data bits of different logic values onto the data channel.

3. The transmission system of claim 1, wherein the primary driver and the secondary driver each comprise a pull-up device and a pull-down device.

4. The transmission system of claim 3, wherein the pull-up and pull-down devices in the primary driver have a greater drive strength than that of the pull-up and pull-down devices in the secondary driver.

5. The transmission system of claim 3, wherein the pull-up device in the secondary driver is activated when the driver stage is required to transmit consecutive logic low bits onto the data channel.

6. The transmission system of claim 3, wherein the pull-down device in the secondary driver is activated when the drier stage is required to transmit consecutive logic high bits onto the data channel.

7. The transmission system of claim 3, wherein any one of the pull-up and pull-down devices in the first driver and the second driver is a transistor.

8. The transmission system of claim 3, wherein any one of the pull-up and pull-down devices in the first driver and the second driver form an open circuit when deactivated.

9. The transmission system of claim 3, wherein any one of the pull-up and pull-down devices in the first driver and the second driver form a resistance when activated.

10. A method for transmitting a data signal onto a signal wire, comprising:
    detecting for a pattern of bits to be transmitted on the data signal;
    when consecutive bits of equal logic value are detected, inducing current flow on the signal wire in a direction opposite to a direction of current flow on the signal wire induced when the first of the consecutive bits was detected; and
    transmitting the data signal.

11. An apparatus, comprising:
    means for propagating a signal between at least two circuits;
    means for driving the signal onto the means for propagating, the means for driving comprising:
        primary means for driving a first bit on the means for propagating, wherein current flow on the means for propagating is induced in a first direction when driving the first bit, and
        secondary means for inducing current flow on the means for propagating in a second direction opposite to the first direction when a second bit of the same logic value as the first bit is transmitted, the first bit and the second bit being consecutive; and
    means for receiving the signal.

12. The apparatus of claim 11, the primary means and secondary means each comprising:
    pull-up means for increasing a voltage of the signal; and
    pull-down means for decreasing the voltage of the signal.

13. The apparatus of claim 12, wherein the pull-up means and the pull-down means in the primary means have a greater driver strength than that of the pull-up means and the pull-down means in the secondary means.

* * * * *